US005290417A

United States Patent [19]

Zejda

[11] Patent Number: 5,290,417

[45] Date of Patent: Mar. 1, 1994

[54] APPARATUS WITH AXIAL GAS DISTRIBUTION FOR VACUUM COATING SUBSTRATES ON A CAROUSEL

[75] Inventor: Jaroslav Zejda, Rodenbach, Fed. Rep. of Germany

[73] Assignee: Leybold Aktiengesellschaft, Hanau, Fed. Rep. of Germany

[21] Appl. No.: 862,224

[22] Filed: Apr. 2, 1992

[30] Foreign Application Priority Data

Dec. 30, 1991 [DE] Fed. Rep. of Germany ....... 4143177

[51] Int. Cl.[5] .............................................. C23C 14/34

[52] U.S. Cl. .......................... 204/298.25; 204/298.07; 204/298.28; 204/298.35; 118/719; 118/730

[58] Field of Search ................ 118/719, 730; 414/217, 414/222, 223; 204/298.23, 298.25, 298.28, 298.26, 298.07, 298.35, 298.03

[56] References Cited

U.S. PATENT DOCUMENTS 4,886,592 12/1989 Anderle et al. ..................... 204/298
4,943,363 7/1990 Zejda et al. ................ 204/298.25 X
4,969,790 11/1990 Petz et al. ........................... 414/127
4,987,856 1/1991 Hey et al. ....................... 118/730 X

FOREIGN PATENT DOCUMENTS 3827343 2/1990 Fed. Rep. of Germany .
1-263273 10/1989 Japan .

*Primary Examiner*—Nam Nguyen
*Attorney, Agent, or Firm*—Felfe & Lynch

[57] ABSTRACT

A coating machine (1) has a carousel (5) with location seats (18, 19) for substrates (3) that are to be coated. Process chambers (8) are located in a circle coaxially to the carousel (5) outside of the carousel (5). All substrates (3) located in the process chambers (8) can be removed at the same time from the process chambers (8) and put down on the carousel (5) by means of substrate transfer devices (9). After turning the carousel (5) slightly, new substrates (3) can be transported simultaneously into the process chambers (8).

14 Claims, 5 Drawing Sheets

7
11
16
1
17
9
8
3c
3a
4
3
5
2
13
10
6
31
12
15
32
14

20b
7
23
20a
22
5
21
20
2

7

25
5
22
25a
25b
21
25c
24a
24b
24
24c
20
8
8a
8b
8c 16
5
21
22
26
23
14
11
6
15
22a
12
8

APPARATUS WITH AXIAL GAS DISTRIBUTION FOR VACUUM COATING SUBSTRATES ON A CAROUSEL

BACKGROUND OF THE INVENTION

The invention relates to a coating machine with several process chambers that are located on arcs of a circle around a common center line which are each connected with a vacuum line and a gas line. The coating machine has a carousel with substrate location seats located coaxially to the center line. The purpose of this carousel is the transport of substrates that are to be coated in the process chambers.

Coating machines of the afore-mentioned type are sold by the Leybold company under the name "Circulus" for example for the purpose of coating optic data carriers by means of cathode sputtering and are therefore known. This known coating machine has a carousel that is designed like a star-shaped transfer arm, which moves the substrates that are to be coated from process chamber to process chamber in a clocked turning motion so that the substrates can undergo different treatment processes in the various process chambers. The evacuation and gas supply for each process chamber is independent from all the other process chambers so that monitoring features are provided for each process chamber in order to control the existing process conditions. With coating machines it is often desirable to operate several process chambers in parallel formation, in order to achieve high level of productivity. This is the case when hollow parts or similar objects are to be coated since with parts of this type the entire coating system can be applied in a single process chamber. If several process chambers are operated in parallel formation, one has to ensure that absolutely identical conditions exist in all process chambers. As a result of different decreases in the flow rate, evacuation pipes or gas supply lines of varying lengths lead for instance to varying pressures in the process chambers. It follows that it must be possible to control all process chambers individually and that they must be equipped with the necessary controlling and measuring equipment in order to create identical process conditions.

SUMMARY OF THE INVENTION

This invention is based on operating several process chambers on a parallel basis with a minimum requirement for controlling and monitoring features.

The vacuum line is provided with a collective evacuation conduit located on an axis parallel the center line, from which radial connection conduits lead directly or indirectly to the process chambers.

The removal by suction can be totally identical for all process chambers a result of this central collective evacuation conduit. This results therefore in totally identical decreases in flow rate toward all process chambers so that the resulting vacuum is always identical which is a requirement for even coating of all substrates that are to be treated simultaneously. In order to reduce costs of the system it is helpful if shared central sensors are provided for all process chambers to monitor the process conditions. The design of the coating machine with a central collective evacuation conduit makes it possible not to have to monitor and control the vacuum and the other process conditions in each individual process chamber.

The coating machine has a particularly simple design if the process chambers are connected to a ring conduit running along the process chambers which are connected to the collective evacuation conduit by means of the radial connecting conduits. This design makes it possible to have fewer radial connection conduits than the number of the process chambers. To mention an example, four connection conduits are sufficient to supply thirty two process chambers that are connected to the collective exhaustion conduit with an even vacuum.

The location of the central collective evacuation conduit can save a particularly large amount of space if the carousel has a ring-shaped design.

It is conceivable that the carousel runs through the individual process chambers so that in each case a substrate carried by the carousel is located in a process chamber. However, it is particularly effective if the coating machine is equipped with a substrate transfer device in each process chamber in order to transport the substrate between the respective substrate location seats on the carousel and a location seat in the process chamber. This design makes it possible to transport finished coated substrates away by means of the carousel and to load it with substrates that still need to be coated while the coating process is underway in the individual process chambers. This can significantly reduce the idle time required for the exchange of the substrates in the process chambers after the coating process is completed.

An additional factor contributing to the reduction of idle time is to provide the carousel with twice as many substrate location seats as the total number of process chambers. This makes it possible to load new substrates only into every second substrate location seat of the carousel. Then the carousel is timed in such a way that initially an empty substrate location seat is located in front of each process chamber so that it can receive a finished substrate from the respective process chamber. Subsequently, the carousel only needs to be timed in such a way that it moves an angle equivalent to one substrate location seat in order to bring the new substrates into transfer position with the individual process chambers.

The carousel has a particularly simple low-weight design and can be set in motion with little effort by means of conventional, easily available components if it is composed of a hub and a ring equipped with the substrate location seats that is connected to the hub by means of spokes and if a turntable is provided for the propulsion of the carousel. This turntable is equipped with a stepping motor and is sturdily attached to the hub.

The gas supply to the individual process chambers can also be very even without the necessity for measuring and control features in the individual process chambers if the gas line has a gas supply conduit located on the same axis as the center line. Radial gas lines run to the individual process chambers from this gas supply conduit. The coating machine has a particularly simple design if it is designed for the simultaneous exchange of substrates from all process chambers.

Alternatively, several adjacent process chambers can be combined into one process chamber unit that will be loaded jointly. This offers the advantage that individual process chamber units can be switched off in case of failures so that the coating machine can continue to operate with the remaining process chambers. Furthermore, different coating processes could be completed one after the other in different process chamber units.

The process chamber units can have a very simple design if the process chambers inside are located on a straight line tangent to a circle concentric to the center line of the carousel and if the carousel is equipped for each process chamber unit with the number of substrate location seats that corresponds to the number of the process chambers in a process chamber unit and if it has an equal number of additional substrate location seats along a second tangent line in staggered formation.

The individual process chambers do not require a casing that seals them off from outside if the process chambers are equipped with a supporting plate with at least one vacuum passage and a gas passage in order to be able to place the open front side of a pot-shaped substrate on it so that a sealing effect is achieved. When this design is used the substrates form part of the casing of the respective process chamber.

Generally the coating machine mentioned in the invention can be designed for various coating processes. A particularly advantageous application is, however, the coating of hollow parts. Here it is favorable if the process chambers are equipped with a coating source that can be set up on top of the substrate in order to supply the required energy. If the substrates are flat, as is the case with compact disks, a bell-shaped part could be set up on top of the substrate as a coating source.

The invention allows for numerous variations. In order to further explain the basic principle underlying the invention, three of these variations have been illustrated in the drawing.

DETAILED DESCRIPTION OF THE PREFERRED EMBODIMENTS

Figure 1:
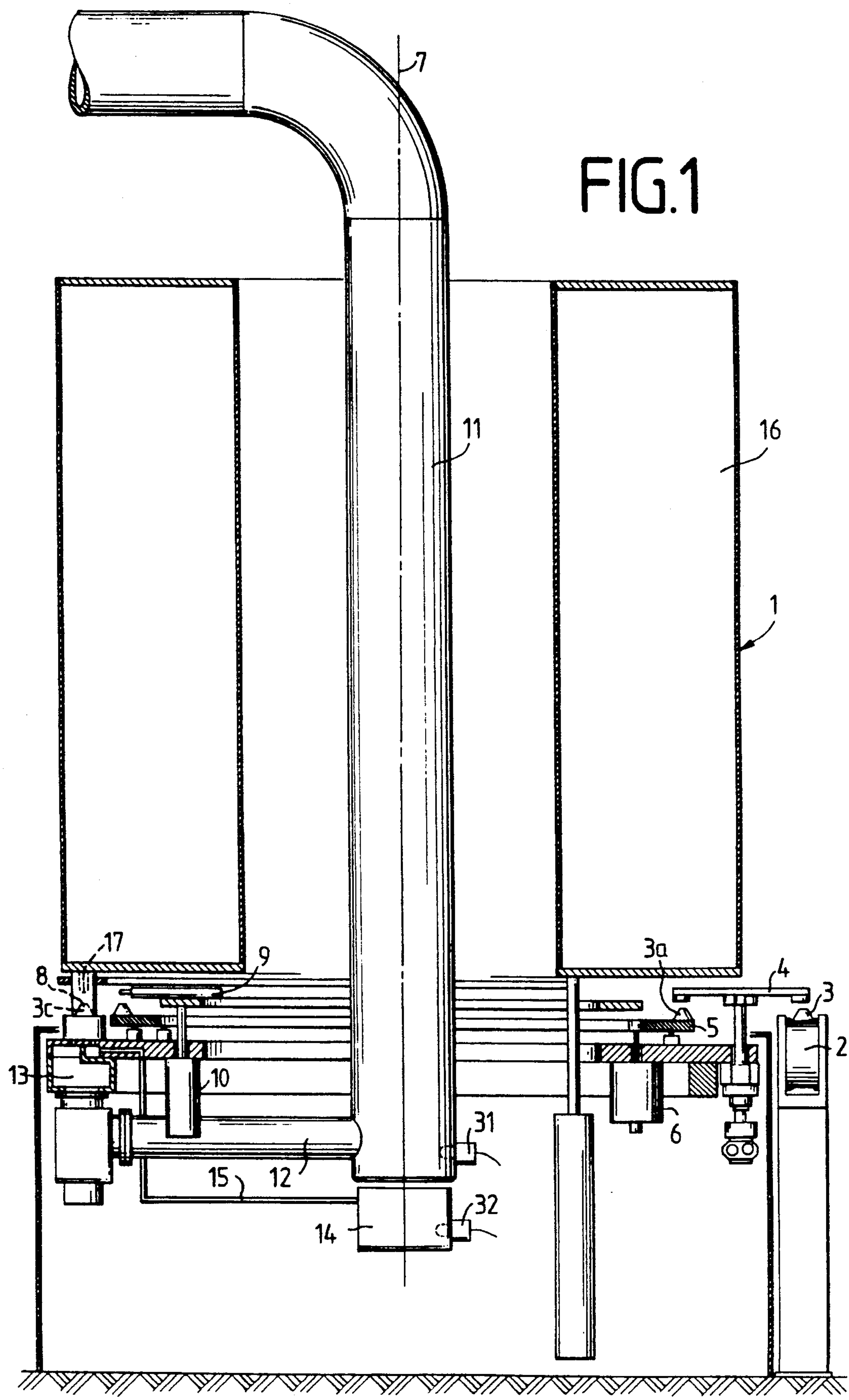
FIG. 1 is a vertical cross-section through a coating machine as set out by the invention.

Referring to FIG. 1 the coating machine 1 is supplied with substrates 3 by means of a linear conveyor belt 2. These substrates have a pot-like shape and are to be coated inside in coating machine 1.

A transfer device 4 which is able to transfer substrates 3, 3*a* between the conveyor belt 2 and a carousel 5 has the function of loading the coating machine 1 with substrates 3. This carousel 5 can be rotated around a center line 7 by means of a stepping motor 6 so that the substrates 3, 3*a* placed on the carousel can be transported to process chambers 8 that are located in a circle around carousel 5. Each process chamber 8 is equipped with a substrate transfer device 9 which is powered by a motor 10 and capable of transferring substrates 3*a*, 3*b*, 3*c* between the carousel 5 and the corresponding process chamber 8.

A collective evacuation conduit 11 located on the same axis as center line 7 of the carousel 5 and connected to a vacuum pump not shown in the illustration is important to the invention. From this collective evacuation conduit 11 radial connecting conduits 12 lead to a ring conduit 13 which is located underneath the process chambers 8. All process chambers 8 have a connection to this ring conduit. Since the distances from the collective evacuation conduit 11 to the process chambers 8 are always the same the result is a totally even vacuum in all process chambers 8.

Gas is supplied centrally through radial gas lines 15 from a gas supply conduit 14 that is also located on the same axis as center line 7.

Figure 5:
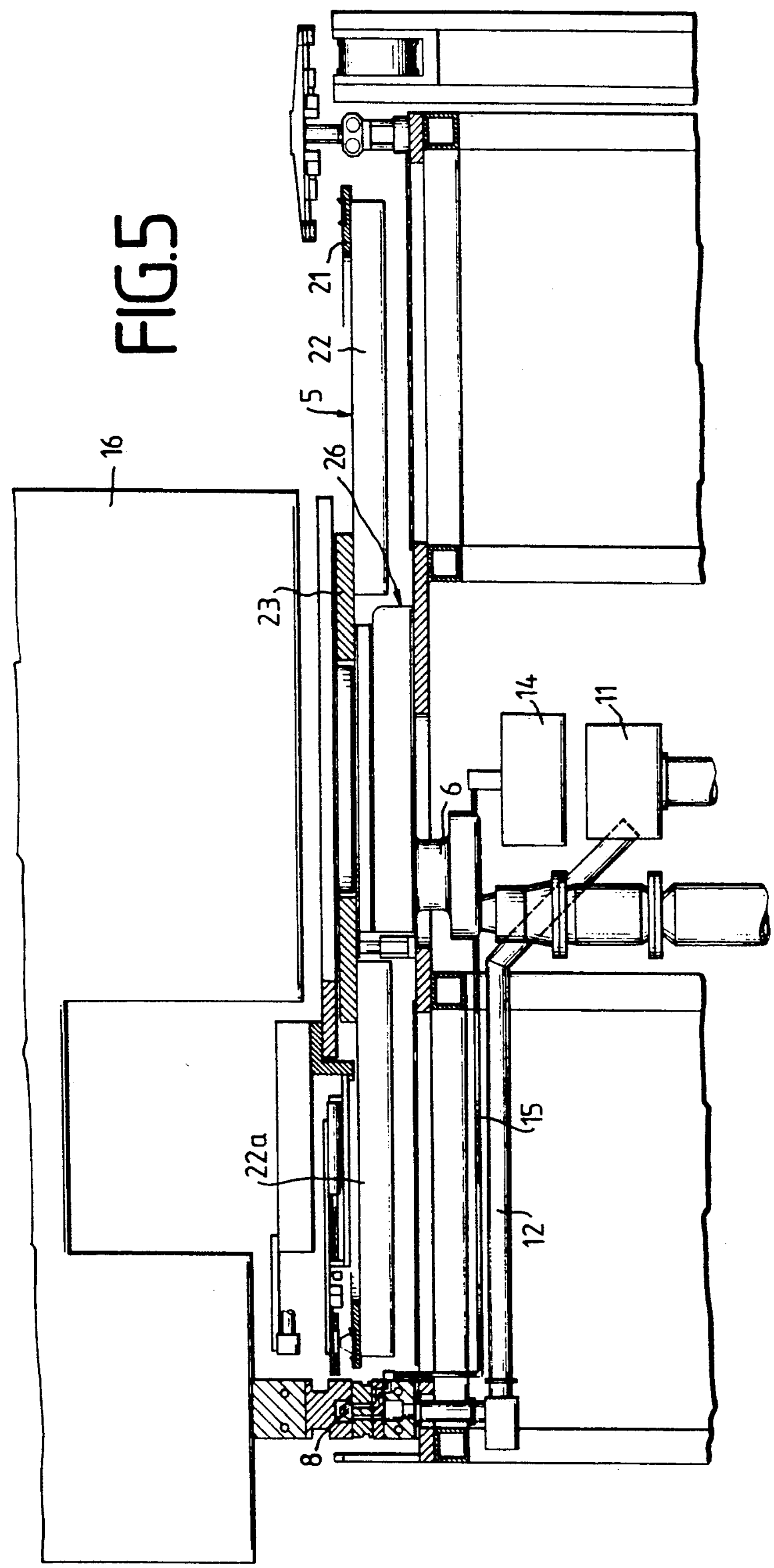
FIG. 5 is a vertical cross-section through an area of a third variation of the coating machine; is essential
Figure 6:
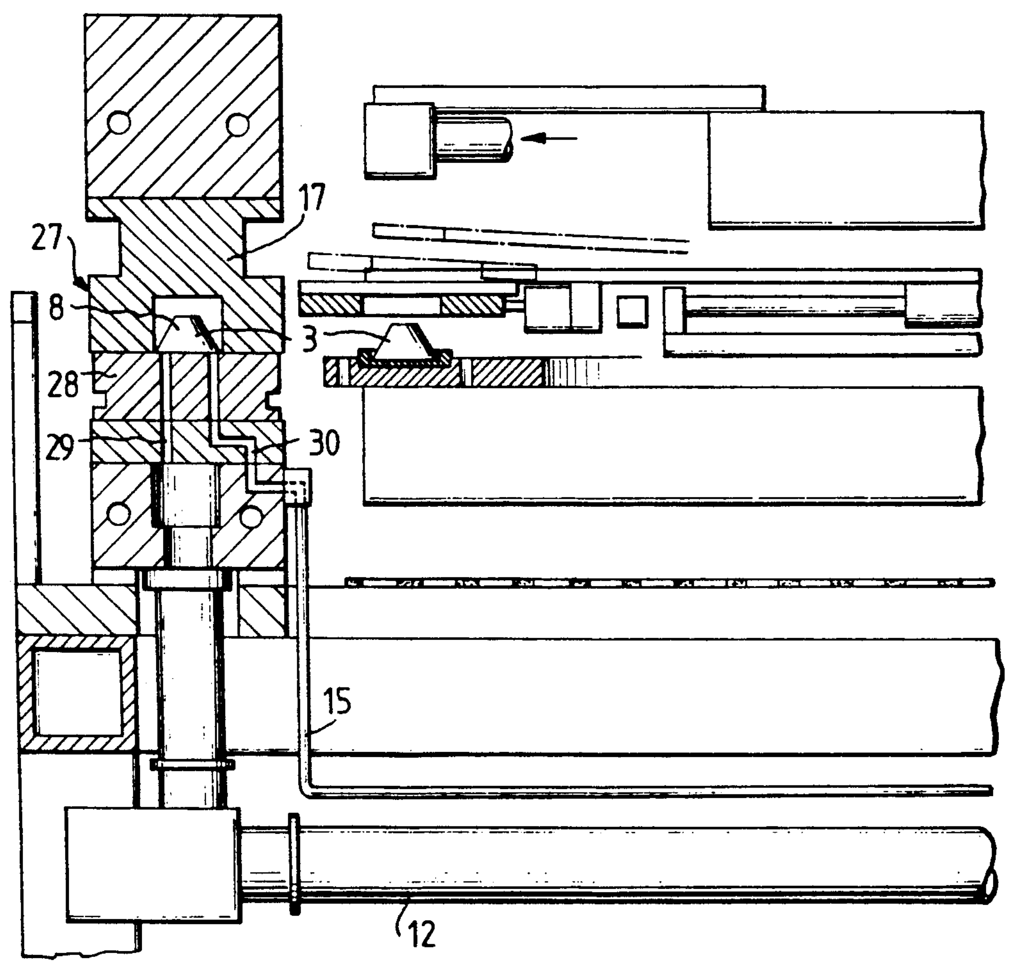
FIG. 6 is an enlarged view of the area at the outer edge of the coating machine in accordance with FIG. 5.

The illustrated coating machine 1 has an energy unit 16, sitting on top of the coating sources 17 for the substrates 3*c* that need to be coated. Since the substrates 3, 3*a*, 3*b*, 3*c* have a pot-like shape and are sitting on their open side, the wall of each substrate 3 can form the outer wall of the respective process chamber 8 which can be seen in more detail in the variation of the invention as illustrated in FIGS. 5 and 6.

The process chambers 8 are controlled centrally by means of sensors 31 and 32 shown schematically. This makes the recording of data in the individual process chambers unnecessary.

Figure 2:
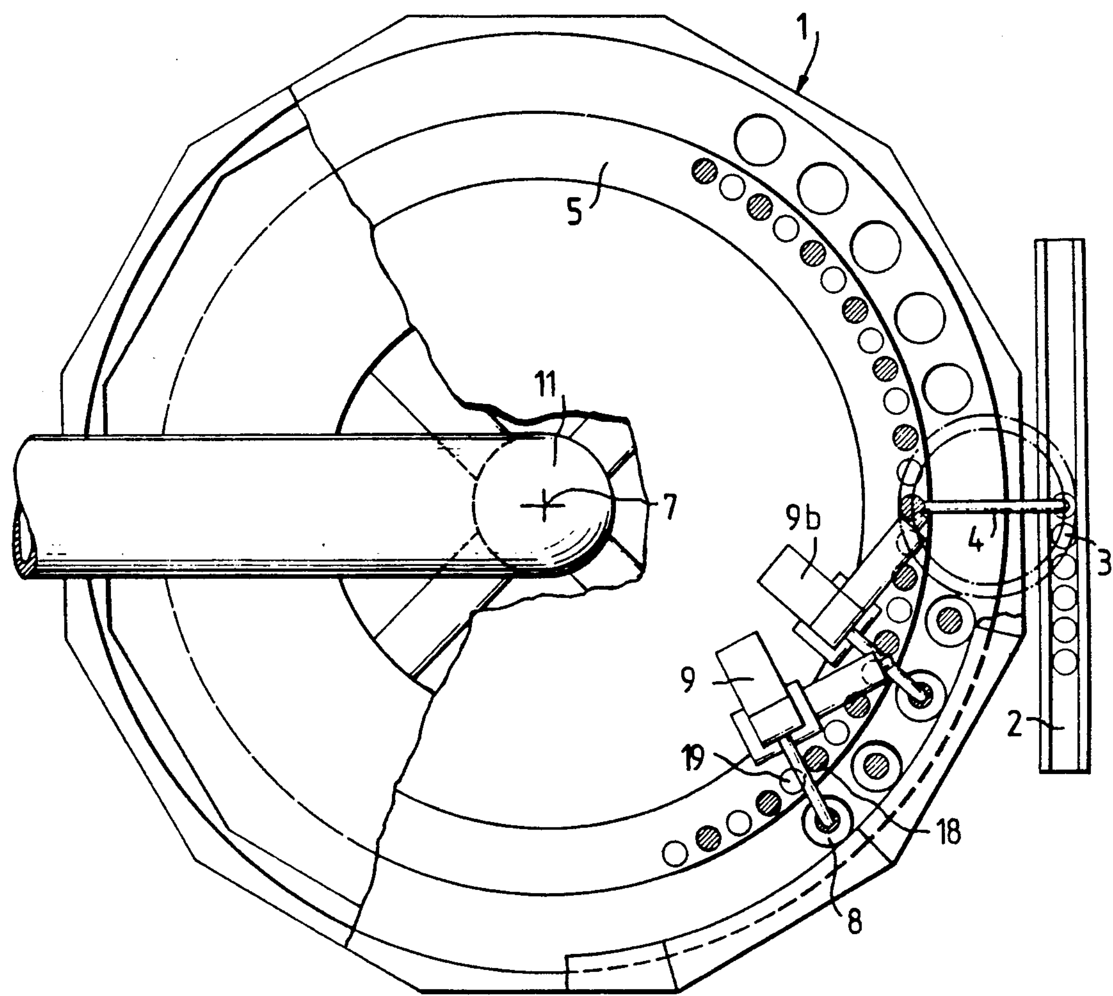
FIG. 2 is a partially cut-away plan view of the coating machine in accordance with FIG. 1.

The top view shown in FIG. 2 illustrates that first and second substrate location seats 18, 19 are located beside each other on the arc of a circle on carousel 5. Located coaxially to the center line 7 and therefore also to carousel 5, the process chambers 8 are located on an arc of a circle on the outer side of the carousel. The number of the substrate location seats 18, 19 is twice that of the process chambers 8. This makes it possible for each substrate transfer device 9, 9*b* belonging to each process chamber 8 to first remove a coated substrate 3 from the respective process chamber 8 and to put it down on an empty substrate location seat 18 at the same time. Subsequently, after the carousel 5 has turned by the angle of one substrate location seat 18, 19, a new substrate 3 is taken from the adjacent substrate location seat 19 and put into the process chamber 8. For this it is only necessary to load every second substrate location seat 19 with a substrate 3 supplied by means of the transfer device 4 from the conveyor 2.

FIG. 2 once again shows the collective evacuation conduit 11 through which all process chambers 8 are evacuated uniformly. In the variation of the invention shown in FIGS. 3 and 4, a total of nine process chamber units, for example process chamber units 20, 20*a*, 20*b*, are located on an arc of a circle that is concentric to center line 7. Each process chamber unit 20, 20*a*, 20*b* contains, as shown in FIG. 4, four process chambers 8, 8*a*, 8*b*, 8*c*. Each of these are connected jointly to a vacuum or to gas.

Figure 3:
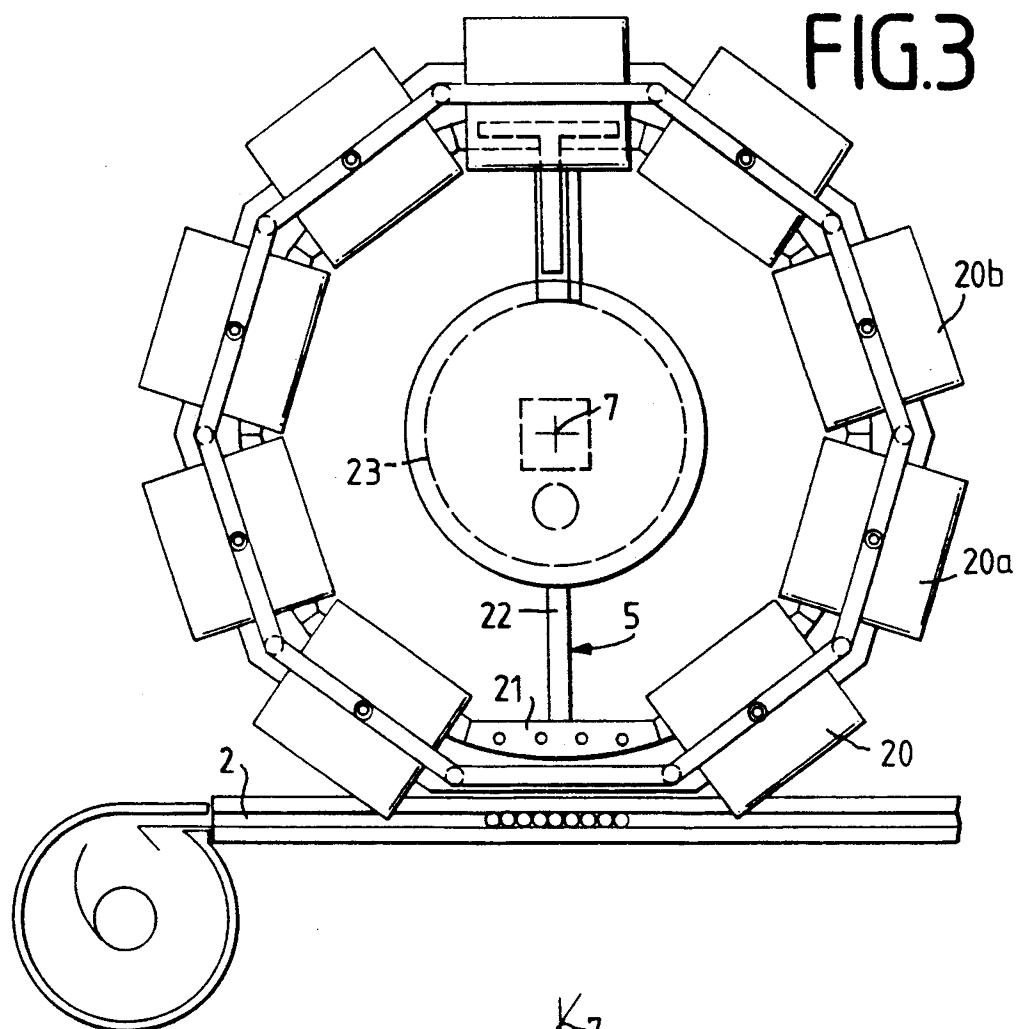
FIG. 3 is a plan view of a second variation of a coating machine as set out by the invention.
Figure 4:
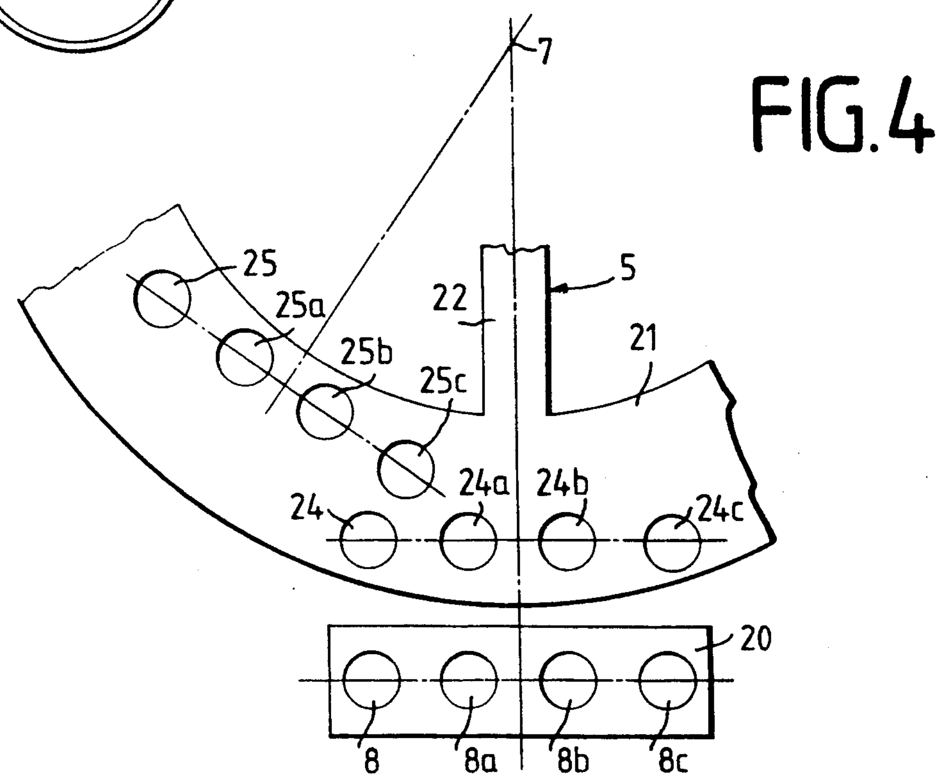
FIG. 4 is a schematic diagram of the transfer area of the substrates in the coating machine.

In FIG. 3 one can see a ring 21, a spoke 22 and a hub 23 forming part of carousel 5. The schematic diagram in FIG. 4 shows four substrate location seats 24, 24*a*, 24*b*, 24*c* on the ring 21 which are located on a tangent to ring 21. They align exactly with the process chambers 8, 8*a*, 8*b*, 8*c* of the process chamber unit 20. Therefore, it becomes possible to easily exchange substrates 3. If one turns the carousel 5 counter-clockwise by 36°, as shown in FIG. 4, four more substrate location seats 25, 25*a*, 25*b*, 25*c*, also located on a tangent, reach a position of alignment with the process chambers 8, 8*a*, 8*b*, 8*c*.

The ring conduit 13 shown in FIG. 1 was omitted in the variation of the invention shown in FIGS. 5 and 6. Instead a separate connecting conduit 12 leads either to each process chamber 8 or to process chamber units (such as units 20, 20*a*, 20*b* of FIG. 3) that are not shown.

The gas is again supplied through gas lines 15 from a central gas supply conduit 14. One can see in FIG. 5 how the carousel 5 is set in motion by a turntable 26 by means of a stepping motor 6. The carousel 5 is attached with its hub 23 on this turntable 26. In FIG. 5 one can furthermore see two of the spokes 22, 22*a* and the ring 21.

FIG. 6 shows an enlarged process station 27 with the process chamber 8 and a substrate 3 located inside. This substrate 3 rests on a supporting plate 28 which is equipped with a vacuum passage 29 and a gas supply passage 30. The vacuum passages 29 are connected with the connecting conduit 12 so that the space inside the substrate forming process chamber 8 can be evacuated. FIG. 6 also shows the gas line 15 which is connected with gas passages 30 in order to supply gas into the process chamber 8.

I claim:

1. Apparatus for coating substrates, comprising a plurality of individually evacuable process chambers located about a central axis, a carousel for transporting substrates circular path about said central axis for coating at said process chambers, said carousel having a plurality of substrate location seats, a central evacuation conduit located coaxially with said central axis, a plurality of radial evacuation conduits connecting said central evacuation conduit to said process chambers.

2. Apparatus as in claim 1 further comprising sensing means fixed to said central evacuation conduit for monitoring process conditions at said coating chambers.

3. Apparatus as in claim 1 further comprising a ring conduit associated with said process chambers, said radial evacuation conduits being connected to said ring conduit.

4. Apparatus as in claim 1 wherein said carousel is ring-shaped.

5. Apparatus as in claim 1 further comprising a plurality of process chamber units arranged in a circle about said central axis, said process chambers being located in said process chamber units, said apparatus further comprising a plurality of substrate transfer devices for transferring substrates from said substrate location seats to said process chambers.

6. Apparatus as in claim 1 wherein the carousel has twice as many substrate location seats as the total number of process chambers.

7. Apparatus as in claim 1 wherein said carousel comprises a ring on which said substrate location seats are located, a central hub, and a plurality of spokes connecting said hub to said ring, said apparatus further comprising a turntable fixed to said hub and a stepping motor for driving said turntable.

8. Apparatus as in claim 1 further comprising a central gas supply conduit located coaxially with said central axis and a plurality of radial supply conduits connecting said central supply conduit to said process chambers.

9. Apparatus as in claim 1 further comprising substrate transfer means which simultaneously transfers substrates from all process chambers to respective substrate location seats on said carousel.

10. Apparatus as in claim 1 further comprising a plurality of process chamber units arranged in a circle about said central axis, each process chamber unit having a plurality of process chambers therein, each process chamber unit being connected to a respective radial evacuation conduit.

11. Apparatus as in claim 10 wherein said process chambers are located on a straight line within each process chamber unit, said straight line being tangent to a circle concentric to the central axis, said substrate location seats being located on a series of straight lines which are tangent to circles concentric to said central axis, the number of location seats in each straight line being equal to the number of process chambers in a process chamber unit.

12. Apparatus as in claim 1 wherein adjacent straight lines of substrate location seats are tangent to circles of different diameters.

13. Apparatus as in claim 1 wherein each process chamber comprises a support plate having an evacuating passage and a gas supply passage therethrough, whereby a cup shaped substrate maybe placed over said passages so that an individual process environment is achieved.

14. Apparatus as in claim 1 wherein each said process chamber comprises a pot-like substrate and a supporting plate on which said substrate is positioned, said apparatus further comprising a vacuum passage connecting each process chamber to one of said radial evacuation conduits.

* * * * *